United States Patent
Micheloni et al.

(10) Patent No.: US 6,809,961 B2
(45) Date of Patent: Oct. 26, 2004

(54) REGULATION METHOD FOR THE DRAIN, BODY AND SOURCE TERMINALS VOLTAGES IN A NON-VOLATILE MEMORY CELL DURING A PROGRAM PHASE AND CORRESPONDING PROGRAM CIRCUIT

(75) Inventors: Rino Micheloni, Turate (IT); Sabina Mognoni, Monza (IT); Ilaria Motta, Cassolnovo (IT); Andrea Sacco, Alessandria (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/331,116

(22) Filed: Dec. 27, 2002

(65) Prior Publication Data

US 2003/0151949 A1 Aug. 14, 2003

(30) Foreign Application Priority Data

Dec. 28, 2001 (EP) .............................................. 01830833

(51) Int. Cl.$^7$ ............................................... G11C 16/04
(52) U.S. Cl. ................................. 365/185.03; 365/185.2
(58) Field of Search ........................... 365/168, 185.03, 365/185.2, 185.21, 185.22, 185.23

(56) References Cited

U.S. PATENT DOCUMENTS

| 5,748,534 | A | * | 5/1998 | Dunlap et al. | ......... 365/185.21 |
| 5,835,420 | A | | 11/1998 | Lee et al. | ............. 365/189.09 |
| 6,185,130 | B1 | * | 2/2001 | Hollmer et al. | .......... 365/185.2 |
| 6,307,660 | B1 | * | 10/2001 | Cordell et al. | ............... 359/189 |
| 6,681,103 | B1 | * | 1/2004 | Rogers et al. | ............... 455/302 |

FOREIGN PATENT DOCUMENTS

| EP | 0800176 | 10/1997 | ............ G11C/5/14 |
| EP | 0905710 | 3/1999 | ............ G11C/16/06 |

* cited by examiner

*Primary Examiner*—David Nhu
(74) *Attorney, Agent, or Firm*—Allen, Dyker, Doppelt, Milbrath & Gilchrist, P.A.; Lisa K. Jorgenson

(57) ABSTRACT

A method and program-load circuit is for regulating the voltages at the drain and body terminals of a non-volatile memory cell being programmed. These voltages are applied from a program-load circuit connected in a conduction pattern to transfer a predetermined voltage value to at least one terminal of the memory cell. The method includes a step of regulating the voltage value locally, within the program-load circuit, to overcome the effect of a parasitic resistor present in the conduction pattern.

15 Claims, 10 Drawing Sheets

REGULATION METHOD FOR THE DRAIN, BODY AND SOURCE TERMINALS VOLTAGES IN A NON-VOLATILE MEMORY CELL DURING A PROGRAM PHASE AND CORRESPONDING PROGRAM CIRCUIT

FIELD OF THE INVENTION

The present invention relates to a method of regulating locally the voltages at the drain and body terminals of a non-volatile memory cell being programmed. More particularly, the invention relates to a method of regulating the voltages at the drain and body terminals of a non-volatile memory cell being programmed, wherein the voltages are applied through a program-load circuit connected in a conduction pattern for transferring a predetermined voltage value to at least one terminal of the memory cell. The invention further relates to a program-load circuit connected in a semiconductor-integrated electronic memory device that comprises a non-volatile memory cell array, with each memory cell including at least one floating gate transistor formed with source, drain, gate, and body terminals, the program-load circuit being connected in a conduction pattern for transferring a predetermined voltage value to a terminal of the memory cell.

BACKGROUND OF THE INVENTION

As is well known in this technical field, a pressing demand of a world-wide semiconductor market for high-density non-volatile memories, e.g., flash EEPROMs, has led to so-called "multi-level" memory devices being developed in which each memory cell can store more than one bit. Each bit is associated with a predetermined logic level, and the levels have been made identifiable by providing the memory cell with a plurality of threshold voltages. A skilled person in the art will surely appreciate that, as the number of threshold voltage levels increases, the requirements become stricter with regards to proper performance of the operations to be carried out on the cells, such as the erase, program, and read operations.

For a reliability reason, the voltage range available for assigning the $2^n-1$ distributions (all of them but the most programmed one) of a multi-level non-volatile memory having n bits per cell lies below 4.5 to 5 V. As a result, both the widths of the threshold distributions and the gaps between them have to be reduced. FIG. 1 of the accompanying drawings represents the distribution of threshold voltages of a conventional two-level (two bits per cell) memory cell compared to that of a multi-level memory having three bits per cell. Thus, a set of phenomena should be taken into account in the fabrication of multi-level memory devices which are instead immaterial to conventional flash memories.

A review of how the programming steps proceed in multi-level flash memories may be of assistance toward a better understanding of the features of the invention. Writing into a flash cell includes varying the threshold voltage of the cell to an appropriate extent by storing electrons into its floating gate region. FIG. 2 shows some straight lines representing the characteristic relationship that exists between the voltage applied to the gate terminal of the memory cell and the threshold jump produced by the voltages applied to the drain terminal of the cell being changed.

To program the cell, and obtain distributions of threshold voltages that are adequately accurate for the multi-level mode of operation, the voltage applied to the control gate terminal is varied stepwise between a minimum and a maximum value. The width of the voltage step is the threshold jump being sought, with the drain terminal under optimum conditions. Completing the programming operation by a stepped gate voltage brings about a timing problem, whereby programming time can be reduced or minimized by having a large number of cells programmed in parallel. Parallel programming may be performed using a "Program & Verify" algorithm. As this algorithm is being executed, each program pulse is followed by an operation of reading from the cells being programmed to check that the cells have reached their threshold values.

A properly programmed cell will receive no further program pulses, whereas any cells that are still below the desired threshold value are re-programmed by the same algorithm. For this purpose, program-load circuits are employed, by applying to the drain terminals of the cells to be programmed, predetermined program voltage values. An example of these program-load circuits is shown schematically in FIG. 3.

The number of program-load circuits provided matches the parallel programming; for example, 64 program-load circuits would be provided where 64 cells are to be programmed in parallel. Each program-load circuit is supplied a voltage VPD from a voltage booster or a charge pump DRAIN PUMP. The charge pump outputs a voltage value PDOUT, which is then regulated through a drain voltage regulator such that the supply value VPD will be as stable and accurate as possible. Shown schematically in FIG. 4 are sequential functional blocks responsible for generating the supply voltage VDP.

Let us review now some of the problems involved in programming flash cells with two or more bits per cells. Represented in FIG. 5 is a practical example of the positioning of circuit portions connected to the drain terminals of the cells, and of circuit portions arranged to generate the program voltage, in the layout of an electronic memory device. It can be appreciated from this diagram that the charge pump and the regulator lie fairly close to each other, and that the voltage VPD produced will be routed, over metallization lines, to program-load circuits located in proximity to the logic circuit portions used for driving them. The outputs of these program-load circuits are further connected, as by metal routing connections and through column decoding blocks, to the drain terminals of the cells, as FIG. 6 shows in greater detail.

Program-load circuits are clustered in the electronic device layout such that the routing connections between the program-load circuit outputs and the drain terminals of the cells to be programmed can be kept as uniform as possible. However, this only holds true in an ideal case of the output resistance of the voltage regulator being zero. Anyhow, it has been common practice to have the I/O logic circuit portions situated at opposed positions in the electronic device. On this account, a parasitic resistance value $R_{par}$, introduced by the routing connections from the supply VPD, is not to be ignored. This parasitic resistance has the effect of supplying, instead of the voltage VPD, a voltage value VPD' which is a function of the current that flows through the parasitic resistor $R_{par}$.

By definition, a variation in the current demanded from the voltage regulator will not alter its output voltage, at least not in the ideal case. The supply voltage VPD can therefore be considered a constant value as the load varies. It can thus be appreciated that the other voltage, VPD', is a design function of the program-load circuits or, stated otherwise, of the conduction patterns that are associated with the programming operation.

An attempt to address the problem of this variation in drain voltage during the programming step should take into close consideration the routing connections to the voltage VPD, if the parasitic resistance $R_{par}$ is to be reduced or minimized. However, this possible course is made inadequate since the metal connections to the reference supply voltages VPD cannot be expanded indefinitely, due to constraints established by the layout of the electronic device. In addition, an increase in parallel programming would act against addressing the problem, because the current through the parasitic resistor $R_{par}$ would also increase.

SUMMARY OF THE INVENTION

In view of the foregoing background, it is therefore an object of the invention to provide a method for stabilizing the voltages at the drain and body terminals of a multi-level non-volatile memory cell during the cell programming step, which significantly decreases the effects of the parasitic resistors that appear at the interconnections between the supply voltage sources and the circuit portions arranged to be supplied therefrom.

The invention provides a local regulation of the drain voltage at the programming step, by multiplying the last stage of the drain regulator by the number of program-load circuits provided in the electronic device and shifting the stage to a location closer to each of the circuits.

BRIEF DESCRIPTION OF THE DRAWINGS

The features and advantages of the method and the circuit according to the invention will be better appreciated from the following description of embodiments thereof, given by way of non-limitative examples with reference to the accompanying drawings.

DETAILED DESCRIPTION OF THE PREFERRED EMBODIMENTS

With reference to the drawings, in particular to the examples of FIGS. 7 to 10, shown generally at 1 in schematic form is a program-load circuit that embodies this invention and is intended for use in an electronic memory device 2 to locally regulate the voltage values at drain, body and source terminals of non-volatile memory cells 3 as the cells are being programmed. "Memory device" means here any monolithic electronic device incorporating an array of memory cells arranged as rows and columns, and circuit portions that are associated with the cell array to serve functions of addressing, decoding, reading, writing, and erasing the contents of the memory cells. A device of this kind may be a memory chip integrated in a semiconductor and of the electrically erasable non-volatile flash-EEPROM type divided into sections.

Each memory cell comprises a floating gate transistor having source, drain and control gate terminals S, D and C, respectively. Program-load circuits, as previously mentioned, are provided between each circuit portion associated with the cell array. These program-load circuits are each supplied a specific supply voltage, which is generated internally of the integrated memory circuit and regulated by a drain voltage regulator.

In accordance with this invention, the last stage of the drain regulator is multiplied by the number of program-load circuits 1 provided in the electronic device, each stage being shifted to a location closer to each of the program circuits. A program-load circuit structure 1 is provided which is regulated internally such that the voltage applied to the drain terminal of a cell will, within limits, remain stable as a voltage VPD applied to the program-load circuit is varied. In this way, the parasitic resistance $R_{par}$ is not suppressed, but its effect is reduced or minimized.

Figure 1:
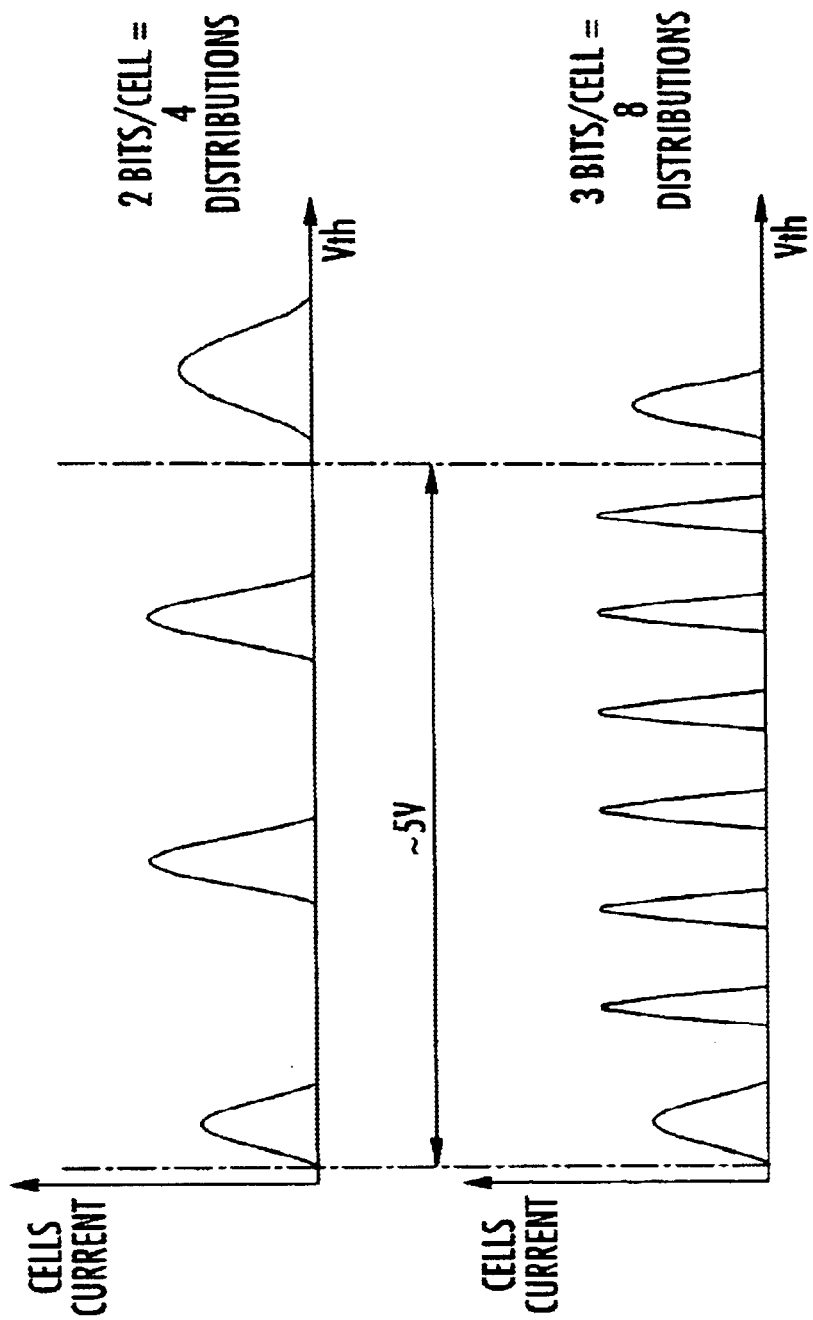
FIG. 1 is a comparative graph of the threshold voltage distribution in a conventional two-level memory cell having two bits per cell and in a multi-level memory having three bits per cell.
Figure 2:
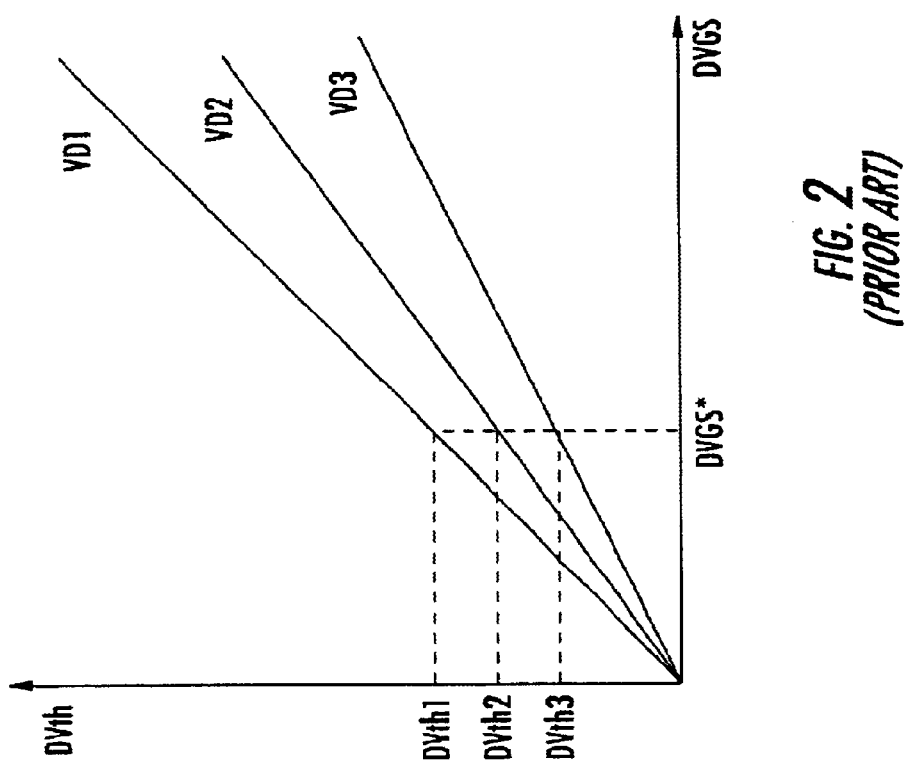
FIG. 2 is a graph of voltage vs. voltage showing characteristic curves of a multi-level memory cell as in the prior art.
Figure 3:
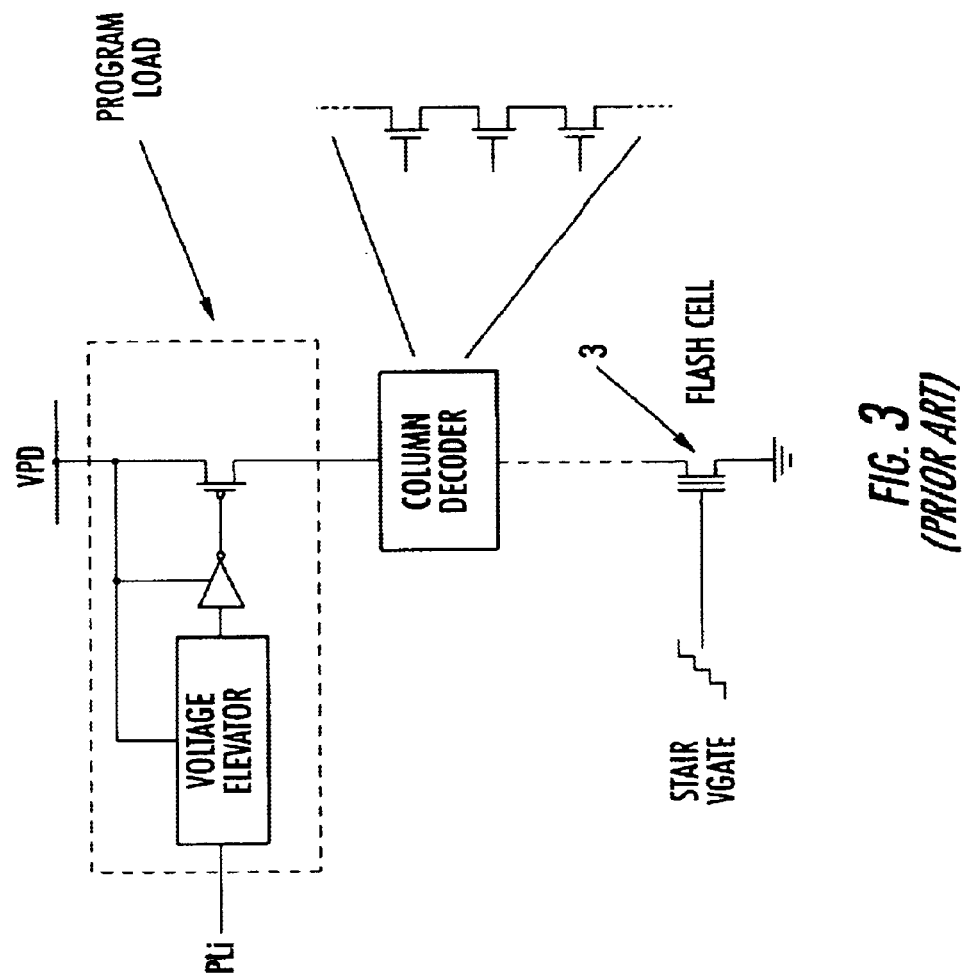
FIG. 3 shows diagramatically a conventional program-load circuit.
Figure 4:
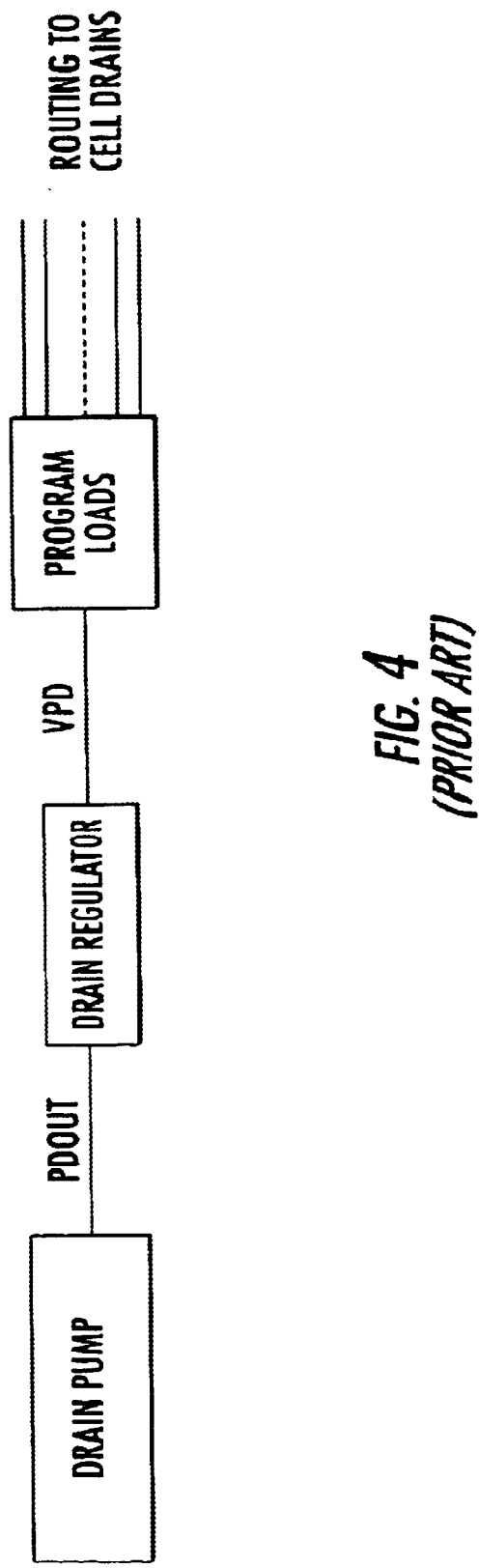
FIG. 4 shows diagramatically a sequence of functional blocks operative to generate a supply voltage to the drain terminals of the memory cells as in the prior art.
Figure 5:
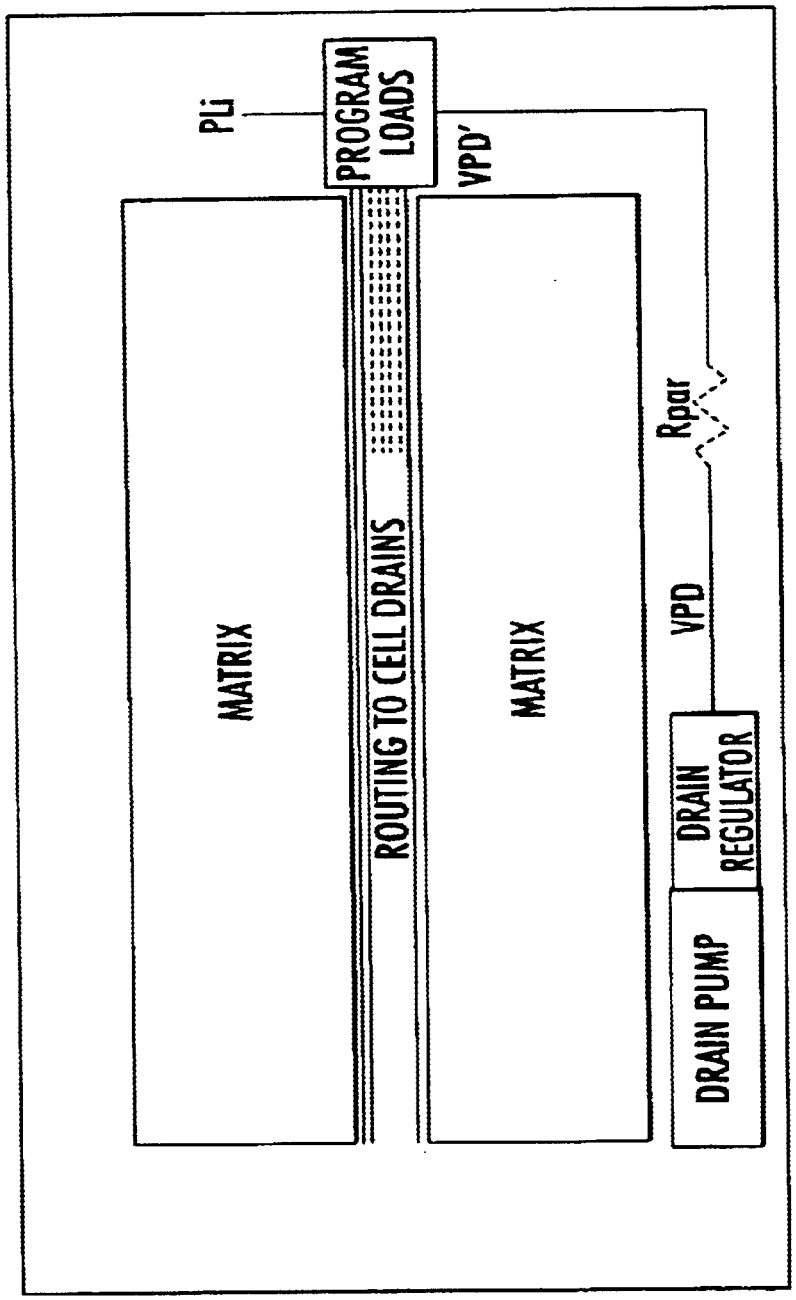
FIG. 5 shows diagramatically a layout of an electronic non-volatile memory device as in the prior art.
Figure 6:
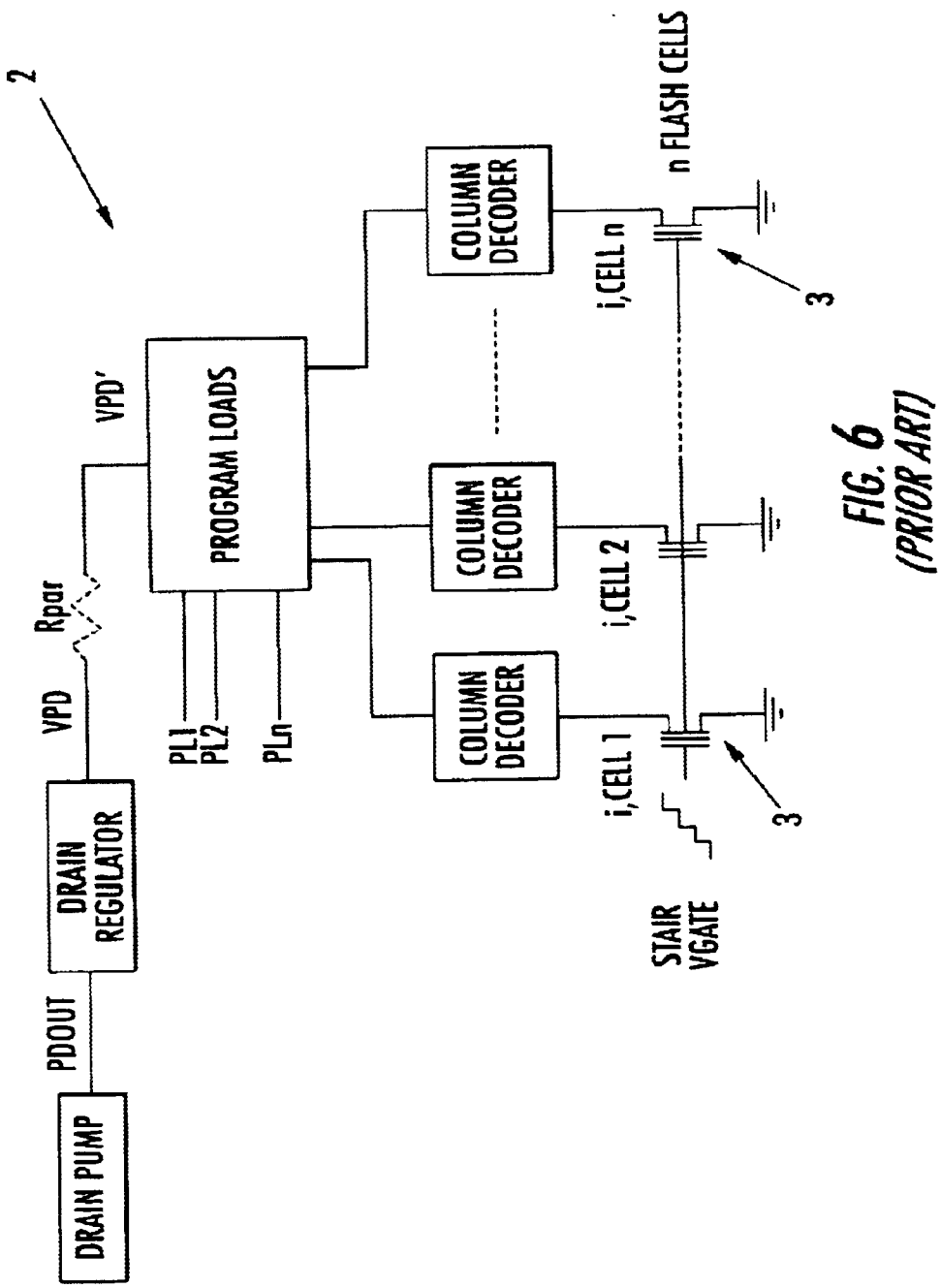
FIG. 6 is a more detailed diagram of the prior art device shown in FIG. 5.
Figure 7:
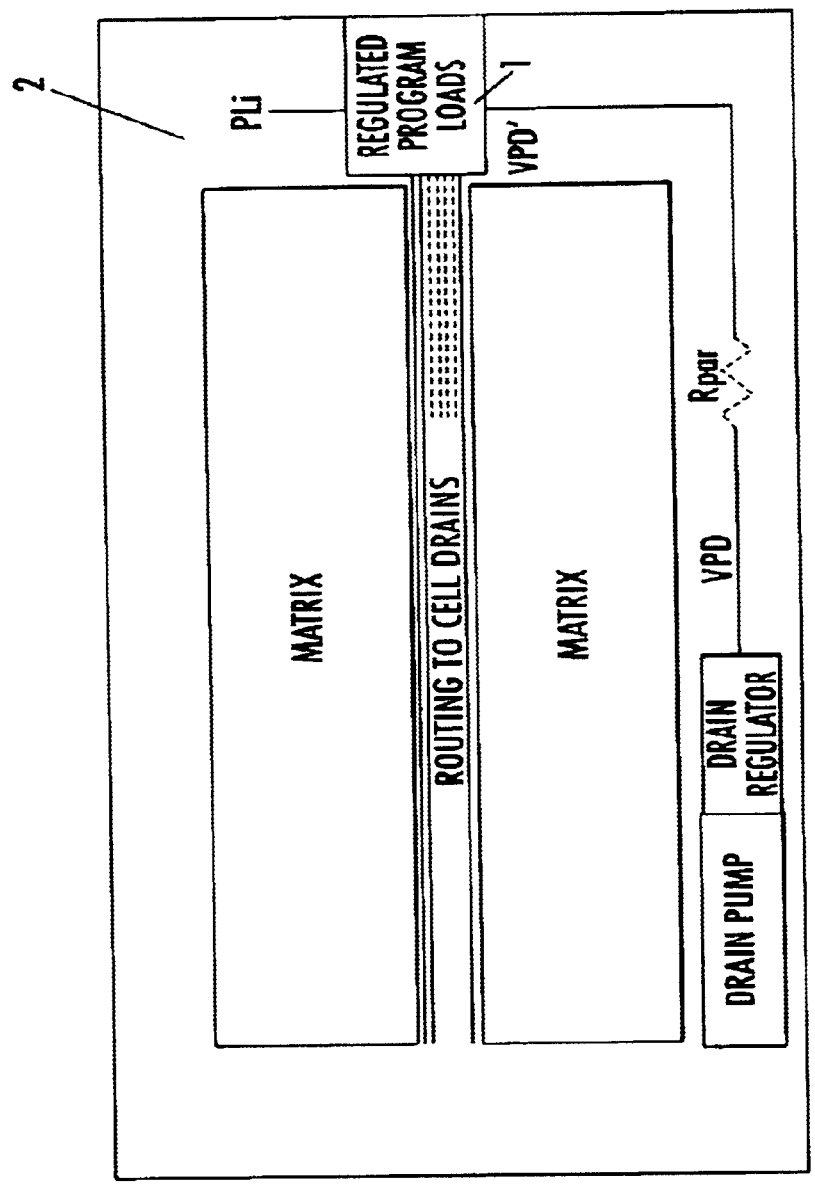
FIG. 7 shows diagramatically a layout of an electronic non-volatile memory device embodying this invention.
Figure 8:
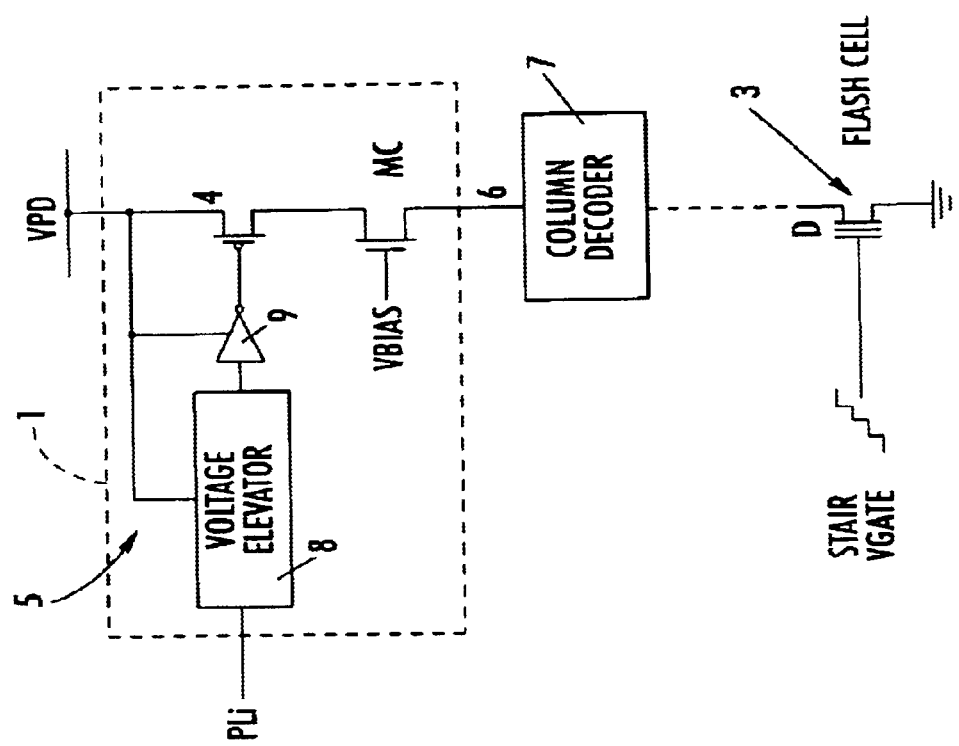
FIG. 8 shows diagramatically a program-load circuit embodying this invention.

This approach has an advantage in that it does not make the routing connections more complicated. FIG. 8 shows the construction of a program-load circuit 1 which is regulated internally in accordance with the invention. A comparison with the prior art shown in FIG. 3 reveals that an n-channel transistor MC has been added here, downstream of a PMOS pass transistor.

In essence, this circuit 1 comprises a local voltage-regulating stage 5 for the voltage to be applied to the cell terminal. This stage is connected in a conduction pattern used for applying the voltage value to this terminal. The circuit 1 further comprises a pass transistor 4 having a first conduction terminal connected to an input of the circuit 1, which input receives a voltage value VPD, and comprises a second conduction terminal connected to an output 6 of the circuit 1. Pass transistor 4 may be a PMOS type of transistor. The output 6 of the circuit 1 is connected to the drain terminal D of a corresponding memory cell 3 via a column decode block 7.

The control terminal of the pass transistor 4 is driven by a voltage booster 8 through an inverter 9. The voltage booster 8 picks voltage from the input supply VPD, and is input an enable signal PLi.

Advantageously, the stage 5 has transistor MC connected in a cascode configuration between the second conduction terminal of the pass transistor 4 and the output 6 of the circuit 1. The gate of transistor MC is driven with a voltage VBIAS of appropriate value.

Let us see now how this design for the program-load circuit 1 can be adapted to address other problems of memory cell program voltage modulation, e.g. to regulating the body voltage of the memory cells 3 locally during the programming step. In latest generation flash memories, the cell substrate is not held to ground during the programming phase, but is rather brought to negative voltage of a suitable value. This allows an electric field to be created which will prevent the hot electrons from diffusing into the substrate by positioning them within areas in the neighborhood of the silicon/tunnel oxide interface, thus enhancing the likelihood of the electrons becoming trapped in the floating gate due to the positive potential that is applied to the control gate of the cell.

Figure 9:
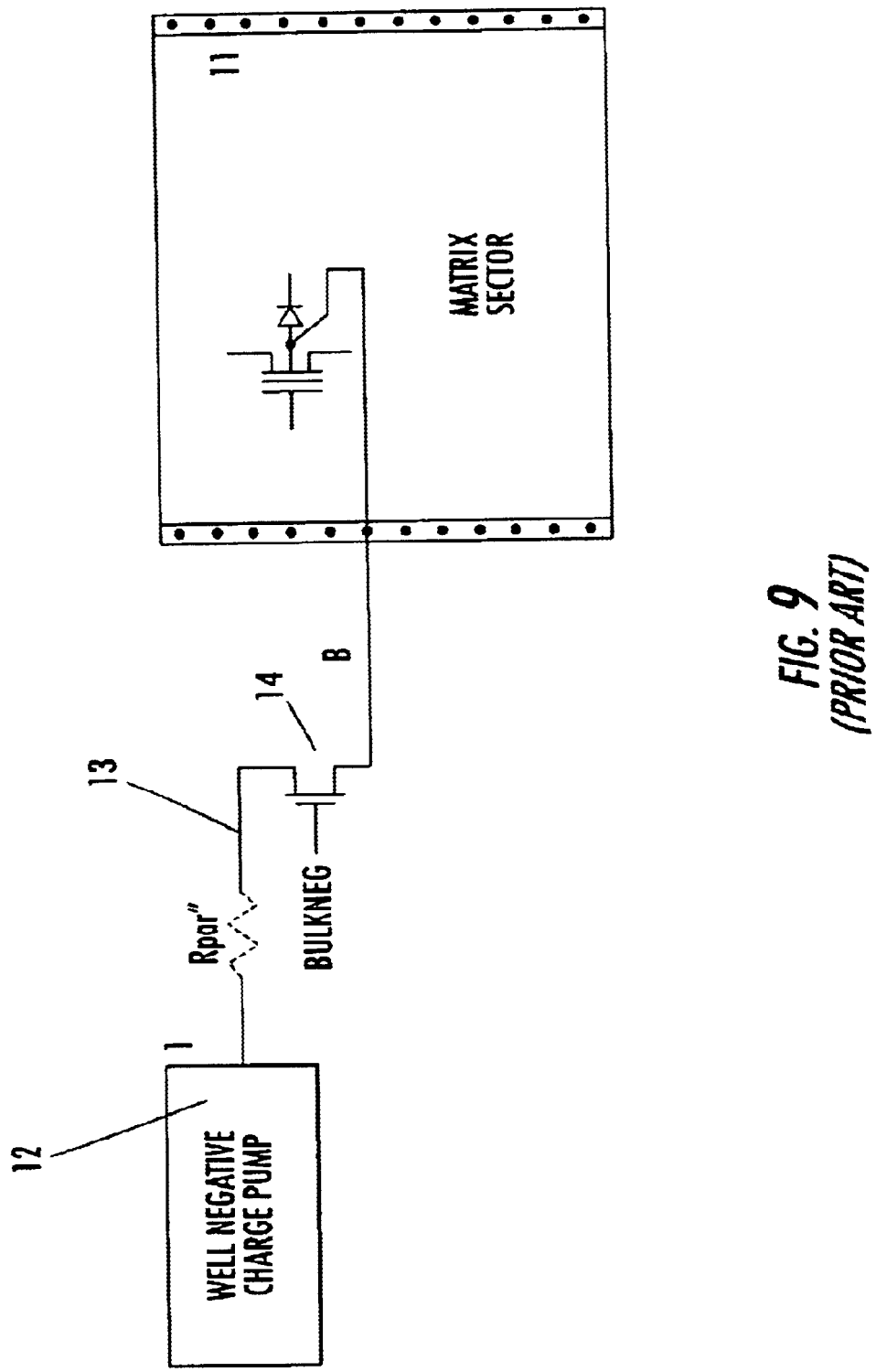
FIG. 9 shows diagramatically a memory cell section in the memory of the device of FIG. 5, and associated circuitry as in the prior art.

The negative voltage for application to the body region during the programming step is generated by a charge pump which is connected at the proper time to the substrate of the section containing the cells to be programmed. Shown schematically in FIG. 9 are a section 11 of a memory cell array, a negative charge pump 12, and a conduction pattern 13 extending between the charge pump 12 and the section 11. A pass transistor 14 is connected in the pattern 13 to apply the negative potential value to the body region of the cells 3.

Thus, during the programming step, the substrate of the cell 3 would be a DC-consuming terminal. Those metal paths of the pattern 13 which carry the negative voltage to the pass transistors have a respective parasitic resistor $R_{par}$. In a similar manner as the total current demand on the drain charge pump, the current demand on the charge pump 12 for delivery to the body region will vary with the programming pattern 13 and the point reached by the algorithm. Here again, the value of the output voltage from the pass transistor 14 via node B in the representation of FIG. 9, undergoes modulation. This results in the voltage applied to the body of cell 3 varying through the program algorithm. In particular, since the number of cells connected at the start of the program algorithm is likely to be large, the voltage drop across the parasitic resistor $R_{par}$ will force the voltage at node B toward less negative values, thereby originating program pulses that are less effective even if the cell drain stays at nominal value. The program pulses that are applied when the number of connected cells is small, e.g. to only program a few cells at the last distributions, are more effective because of the voltage drop across the parasitic resistor $R_{par}$ being smaller, so that node B will be at a more negative voltage. The phenomenon is apt to void the effort made to have the drain voltage regulated locally.

Figure 10:
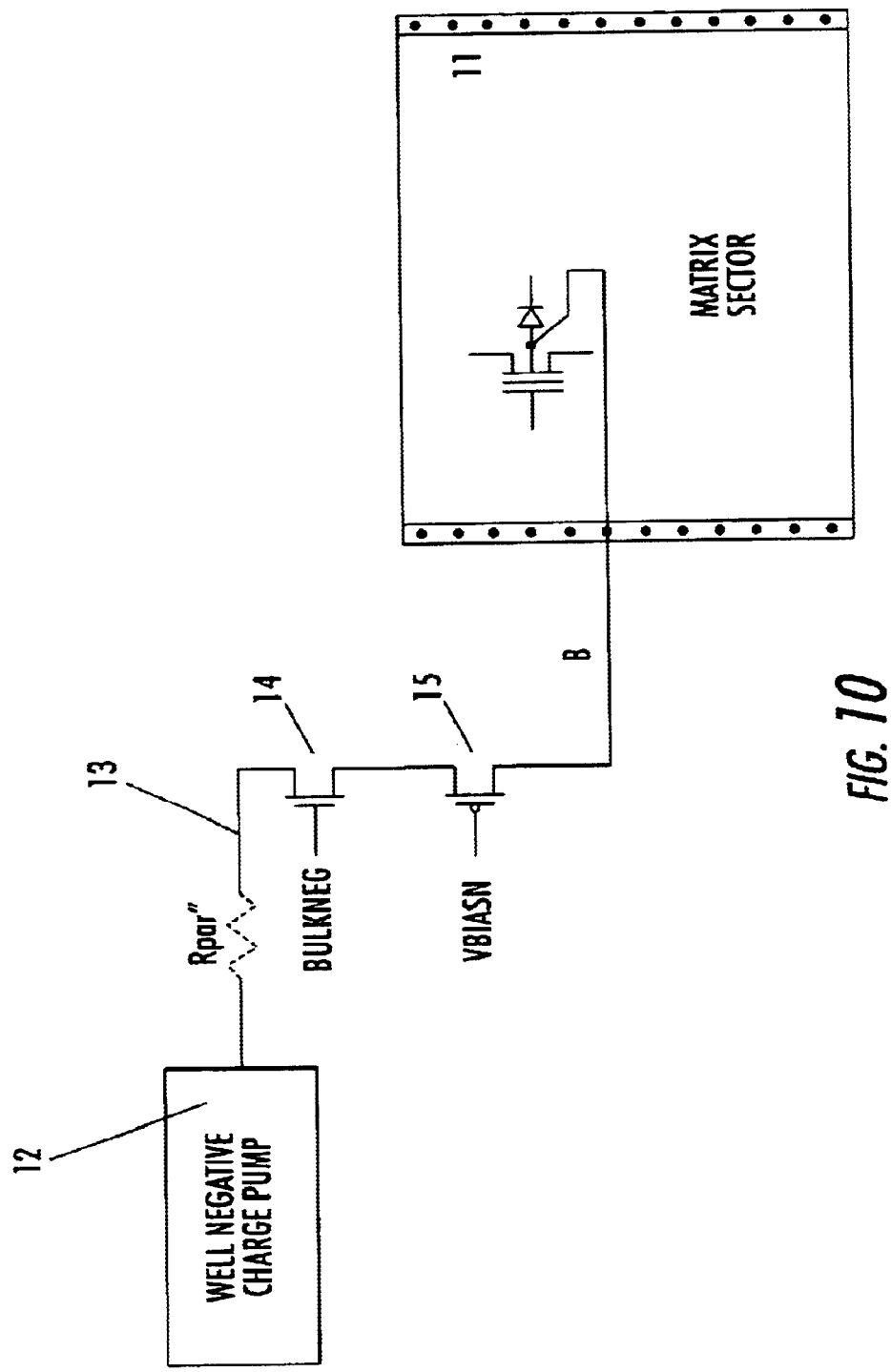
FIG. 10 shows diagramatically a memory cell section in the memory of the device of FIG. 7, and associated circuitry according to the invention.

According to the invention, the body voltage is also regulated locally at each section using a structure which is a mirror image of that discussed for drain voltage regulation. Briefly as shown in FIG. 10, a transistor 15, e.g. a p-channel MOS transistor, is provided between the output of the pass transistor 14 and the node B. This transistor 15 is a cascode configuration to transistor 14 and is biased with a gate voltage VBIASN of a suitable value. Under such conditions, the cascode output, hence the node B, will always be constant even as its input undergoes modulation.

To summarize, the method and program circuit of the invention do address the shortcomings of the prior art, and allow the voltages at the drain and body terminals of memory cells to be stabilized during the steps of programming multi-level flash memories. By acting to maintain such program voltages at a stable value, the above-described invention allows the gate pulses that are applied during the program algorithm to actually produce a threshold voltage jump which is constant for each pulse and for any program patterns.

What is claimed is:

1. A method of applying a voltage to at least one of a drain and body/source terminal of a non-volatile memory cell being programmed using a program-load circuit comprising at least one pass transistor connected to a respective non-volatile memory cell, and a transistor connected in a cascode configuration with the at least one pass transistor, and a conduction pattern having a parasitic resistance associated therewith and being connected to the program-load circuit, the method comprising:
    regulating the voltage locally within the program-load circuit by biasing the transistor connected in the cascode configuration with the at least one pass transistor to overcome an effect of the parasitic resistance in the conduction pattern.

2. A method according to claim 1 wherein a number of the at least one pass transistor varies with a number of cells to be programmed.

3. A method of applying a voltage to a terminal of a non-volatile memory cell being programmed using a program-load circuit comprising cascode-connected transistors and a conduction pattern connected thereto, the conduction pattern having a parasitic resistance associated therewith, the method comprising:
    regulating the voltage locally within the program-load circuit using the cascode-connected transistors to overcome an effect of the parasitic resistance present in the conduction pattern.

4. A method according to claim 3 wherein the terminal comprises a drain terminal of the non-volatile memory cell.

5. A method according to claim 3 wherein the terminal comprises a body terminal of the non-volatile memory cell.

6. A method according to claim 3 wherein the terminal comprises a source terminal of the non-volatile memory cell.

7. A memory device comprising:
    a non-volatile memory cell array;
    a plurality of conduction patterns, each having a parasitic resistance associated therewith; and
    a plurality of program-load circuits for said non-volatile memory cell array and connected to respective conduction patterns, each program-load circuit regulating a voltage therein to overcome an effect of the parasitic resistance present in the conduction pattern, each program load-circuit comprising
        at least one pass transistor connected to a respective non-volatile memory cell, and
        a transistor connected in a cascode configuration with said at least one pass transistor and having a control terminal receiving a bias signal.

8. A memory device according to claim 7 wherein each program-load circuit is connected to a drain terminal of a respective non-volatile memory cell.

9. A memory device according to claim 7 wherein each program-load circuit is connected to a body terminal of a respective non-volatile memory cell.

10. A memory device according to claim 7 wherein each program-load circuit is connected to a source terminal of a respective non-volatile memory cell.

11. A memory device according to claim 7 further comprising a voltage boost block, and wherein said at least one pass transistor is connected between said voltage boost block and the respective non-volatile memory cell.

12. A memory device according to claim 7 wherein a number of said program-load circuits corresponds to a number of non-volatile memory cells being programmed in parallel.

13. A memory device comprising:
    a non-volatile memory cell array, each non-volatile memory cell having a source, drain, gate and body terminals;
    a plurality of conduction patterns, each having a parasitic resistance associated therewith; and
    a plurality of program-load circuits for drain and source/body terminals of said non-volatile memory cell array and connected to respective conduction patterns, each program-load circuit regulating a voltage therein to overcome an effect of the parasitic resistance present in the conduction pattern, each program load-circuit comprising
- at least one pass transistor connected to a respective non-volatile memory cell, and
- a transistor connected in a cascode configuration with said at least one pass transistor and having a control terminal receiving a bias signal.

14. A memory device according to claim 13 further comprising a voltage boost block, and wherein said at least one pass transistor is connected between said voltage boost block and the respective non-volatile memory cell.

15. A memory device according to claim 13 wherein a number of said program-load circuits corresponds to a number of non-volatile memory cells being programmed in parallel.

* * * * *